United States Patent [19]

Davis et al.

[11] 4,349,635
[45] Sep. 14, 1982

[54] LOWER TEMPERATURE GLASS AND HERMETIC SEAL MEANS AND METHOD

[75] Inventors: Earl K. Davis, Tempe; Rafael Landron, Phoenix; Scot W. Taylor, Tempe, all of Ariz.

[73] Assignee: Motorola, Inc., Schaumburg, Ill.

[21] Appl. No.: 315,102

[22] Filed: Oct. 26, 1981

[51] Int. Cl.³ .......................... C03C 7/02; C03C 3/08
[52] U.S. Cl. ........................ 501/15; 65/59.1; 174/50.61; 501/26; 501/67; 501/79; 501/153
[58] Field of Search .................. 501/15, 67, 26, 79

[56] References Cited

U.S. PATENT DOCUMENTS

| | | | |
|---|---|---|---|
| 3,669,715 | 6/1972 | Meyer | 501/26 X |
| 3,706,582 | 12/1972 | Meyer | 501/15 |
| 4,128,697 | 12/1978 | Simpson | 501/67 X |
| 4,152,282 | 5/1979 | Baudry et al. | 501/67 X |

FOREIGN PATENT DOCUMENTS

| | | | |
|---|---|---|---|
| 52-54713 | 5/1977 | Japan | 501/79 |
| 55-109243 | 8/1980 | Japan | 501/21 |
| 55-113641 | 9/1980 | Japan | 501/67 |
| 347802 | 8/1972 | U.S.S.R. | 501/37 |
| 348512 | 8/1972 | U.S.S.R. | 501/26 |

Primary Examiner—Helen M. McCarthy
Attorney, Agent, or Firm—Robert M. Handy

[57] ABSTRACT

An improved lead-free glass or glass plus alumina ceramic sealing material for making compression glass sealed electrical leads in semiconductor device packages is described wherein the improved sealing material consists essentially of the following range of ingredients, by weight percent:

| Element | Pb-free Glass | Composition Range (Glass plus alumina) |
|---|---|---|
| $SiO_2$ | 40–50 | 34–50 |
| $Al_2O_3$ | 2–12 | 2–25 |
| $K_2O$ | 2–6 | 2–6 |
| $Na_2O$ | 5–9 | 4–9 |
| $Li_2O$ | 2–6 | 2–6 |
| CaO | 0–4 | 0–4 |
| ZnO | 5–12 | 4–12 |
| BaO | 1–5 | 1–5 |
| $TiO_2$ | 2–6 | 2–6 |
| $B_2O_3$ | 13–21 | 11–21 |

4 Claims, 2 Drawing Figures

LOWER TEMPERATURE GLASS AND HERMETIC SEAL MEANS AND METHOD

BACKGROUND OF THE INVENTION

1. Field of the Invention

This invention relates to glass compositions and methods for use in encapsulating electronic devices and, more particularly, to improved glass compositions having controlled expansion properties and fusion temperatures which can be used in glass compression seals for insulating the electric leads of the semiconductor device packages; Improved methods for making seals, and, further, to improved semiconductor devices utilizing these glass compositions and methods.

2. Description of the Prior Art

Insulating glasses which melt or soften at temperatures exceeding 500° C. are conveniently used to provide insulated electrical feedthroughs in the walls of many semiconductor device enclosures. The glass serves to insulate the electrical leads from the metal body or base of the device enclosure, and at the same time to prevent atmospheric contaminants from reaching the interior of the enclosure where they might adversely affect the semiconductor chip. Electrical leads and device enclosures sealed so as to be impervious to atmospheric contaminants are said to be "hermetic." As used herein the word "semiconductor device" is intended to include the semiconductor chip, the sealed electrical leads, and the surrounding enclosure.

Compression glass seals are well known for providing hermetic insulating feedthroughs in electrical enclosures, particularly semiconductor device enclosures. U.S. Pat. No. 4,128,697 to W. M. Simpson describes a typical compression seal structure, which includes an outer metal casing member composed of a relatively high expansion coefficient metal, a lead-in conductor of a relatively low expansion coefficient metal passing through a hole in the outer casing member, and a glass seal of relatively low or intermediate expansion coefficient glass filling the annular opening between the casing and the metal lead. This selection of relative coefficients of expansion tends to keep the glass in compression, hence the designation of "compression seal."

Several glass compositions have been developed in the prior art which provide useful hermetic compression seals. For example, TO-3 type semiconductor packages are widely used. These packages typically have a 1010-alloy steel base in which are mounted two or more 52-alloy lead-in wires sealed with Corning Type 9013 glass. Corning Type 9013 glass is manufactured by Corning Glass Works, Corning, N.Y. 52-alloy and 1010-alloy are American National Standard designations defined in ANSI/ASTM Standard Specifications F30-77 and A29-79 respectively. These materials are well known in the art.

A compression glass seal is typically made by heating the assembled pieces (base, lead-in wire, and glass) above the softening and sealing temperature of the glass, usually about 1000° C. This high softening and sealing temperature is a significant disadvantage of prior art glasses, since it precludes the use of base members or lead-in wires which are composed of, or have been plated with, lower melting point materials. For example, in order to improve the corrosion resistance of a 1010-alloy steel base, it is important to be able to use a protective plating. However, some desirable protective platings, such as electroless nickel, melt at temperatures less than the sealing temperature of the prior art glass. Electroless nickel is typically a nickel-phosphorous alloy having a melting point less than that of pure nickel. Other alloying materials besides phosphorous are also useful. With the prior art glass, the nickel alloy plating must be applied following the glass sealing operation. This production sequence is undesirable since the leads are frequently bent during the plating operation. Packages with bent leads will jam automated handling equipment unless the leads are straightened. Straightening the leads is time consuming and costly. In addition the bending and straightening degrades the integrity of the hermetic glass seal between the leads and base. Manufacturing yield decreases and cost increases.

Prior art attempts to lower the sealing temperature have resulted in glasses which are either mechanically weaker, chemically less stable, or both. Thus, a need has continued to exist for compression sealing glasses which have a lower sealing temperature while at the same time continuing to exhibit good electrical, mechanical, and chemical properties, particularly resistance to atmospheric corrosion, chemical reduction, and thermal cycling.

Accordingly, it is an object of the present invention to provde an improved glass composition for the fabrication of compression glass seals on electrical devices.

It is a further object of this invention to provde a sealing glass composition with a lower sealing temperature than heretofore achieved without sacrifice of other desirable electrical, chemical, and mechanical properties.

It is an additional object of this invention to provide an improved method for making enclosures for electrical devices, particularly with hermetic sealed lead-in wires for semiconductor devices.

It is a further object of this invention to provide an improved method for making enclosures for electrical devices having hermetic glass sealed lead-in wires wherein a low temperature protective plating is applied to the metal parts prior to glass sealing of the lead-in wires.

It is a still further object of this invention to provide a semiconductor device enclosure of improved properties, including lower cost.

SUMMARY OF THE INVENTION

In accordance with the present invention, there is provided a compression sealing glass of controlled expansion and sealing temperature consisting essentially of the following composition range of materials, in weight percent, rounded to the nearest integer.

| Ingredients | Sealing Glass Composition Range |
| --- | --- |
| $SiO_2$ | 34–50 |
| $Al_2O_3$ | 2–25 |
| $K_2O$ | 2–6 |
| $Na_2O$ | 4–9 |
| $Li_2O$ | 2–6 |
| CaO | 0–4 |
| ZnO | 4–12 |
| BaO | 1–5 |
| $TiO_2$ | 2–6 |
| $B_2O_3$ | 11–21 |

There is further provided in accordance with the present invention a compression sealing glass of controlled expansion and sealing temperature having more closely controlled properties consisting essentially of the following composition range of materials, in weight percent, rounded to the nearest integer:

| Ingredients | Sealing Glass Composition Range |
|---|---|
| $SiO_2$ | 38-47 |
| $Al_2O_3$ | 7-22 |
| $K_2O$ | 3-5 |
| $Na_2O$ | 5-8 |
| $Li_2O$ | 3-5 |
| CaO | 1-2 |
| ZnO | 6-10 |
| BaO | 1-3 |
| $TiO_2$ | 3-5 |
| $B_2O_3$ | 13-20 |

Improved electrical enclosures and semiconductor devices with hermetic insulating leads are obtained using these glass compositions.

Further, improved electrical enclosures and manufacturing methods are provided by first plating the base members and leads of the enclosures with or making them from lower melting point metals or alloys, and then using the above-described glass compositions as a lower temperature compression sealing glass, thereby avoiding damage to these temperature sensitive metals or alloys during the sealing process.

In this application, the words "sealing glass" refer to the glass or glass plus alumina ceramic materials used for compression seals. The words "melt glass" refer to a precursor glass from which the sealing glass is made. The words "feed throughs," "leads," "lead-in wires," or "lead-in pins" refer to the electrical conductors to be attached and sealed to the package base by means of the sealing glass.

DETAILED DESCRIPTION OF THE PREFERRED EMBODIMENTS

Figure 1:
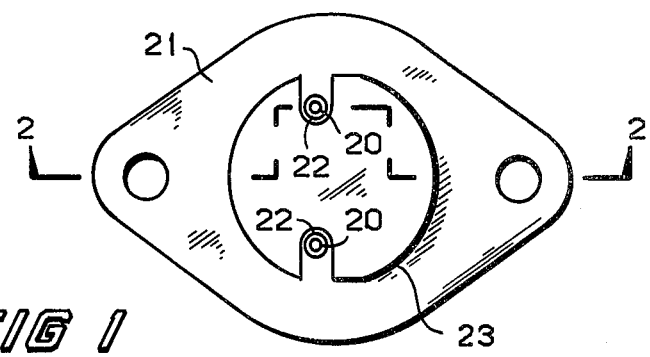
FIG. 1 is a top view of a TO-3 type of semiconductor device package showing the base portion in which two compression glass sealed insulated electrical leads are installed.
Figure 2:
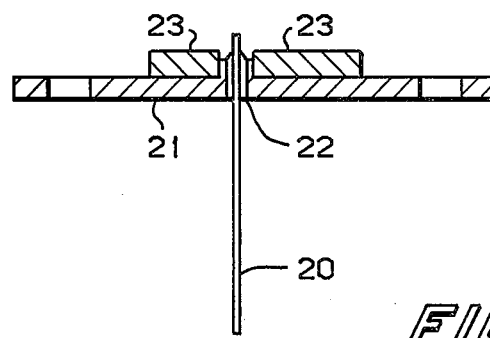
FIG. 2 is a cross-section of the device of FIG. 1 showing the details of a compression glass seal.

FIGS. 1 and 2 show the arrangement and construction details of the typical TO-3 type semiconductor package base including two insulated electrical leads attached with compression glass seals. Leads 20 of 52-alloy are installed in base 21 of 1010-alloy steel by means of compression seal glass 22. Heat spreader 23 is customarily made of copper, but a variety of metals, ceramics, or combinations of heat conductive materials are useful. A semiconductor die or chip (not shown) is attached to heat spreader 23 and electrically connected to leads 20. Encapsulation is typically completed by welding a hat-shaped lid (not shown) onto base 21 over heat spreader 23 or by covering the device, heat spreader, and leads with a plastic material. The means of encapsulation is not important to this invention.

It is desirable that the sealing glass exhibit the following properties: (1) have sufficient strength and mechanical shock resistance to withstand assembly, test, and use in typical semiconductor devices; (2) have a suitable coefficient of expansion to complement the metal subcomponents so that hermetic compression seals are obtained; (3) be resistant to chemically reducing and corrosive atmospheres that may be encountered during manufacturing and use; (4) be resistant to devitrification so that the glass remains vitreous during the preparation of the sintered glass preforms used in assembly of the device package, and during the sealing cycle in which the glass is bonded to the package base and leads; (5) be resistant to thermal cycling and temperature shock so as to avoid cracking of the glass and loss of hermeticity during sealing, testing, and use; and (6) be a low loss electrical insulator.

A glass composition (melt glass) has been discovered which when melted, ground and mixed with a predetermined amount (0-15%) of alumina ($Al_2O_3$) ceramic powder provides a sealing glass (i.e. glass plus alumina ceramic mixture) which meets the above requirements. Table I lists the useful and preferred composition ranges of the melt glass and sealing glass of the present invention in weight percent, rounded to the nearest integer.

TABLE I

| Element | Useful Melt Glass Composition Range | Useful Sealing Glass Composition Range | Preferred Melt Glass Composition Range | Preferred Sealing Glass Composition Range |
|---|---|---|---|---|
| $SiO_2$ | 40-50 | 34-50 | 43-47 | 38-47 |
| $Al_2O_3$ | 2-12 | 2-25 | 7-11 | 7-22 |
| $K_2O$ | 2-6 | 2-6 | 3-5 | 3-5 |
| $Na_2O$ | 5-9 | 4-9 | 6-8 | 5-8 |
| $Li_2O$ | 2-6 | 2-6 | 3-5 | 3-5 |
| CaO | 0-4 | 0-4 | 1-2 | 1-2 |
| ZnO | 5-12 | 4-12 | 7-10 | 6-10 |
| BaO | 1-5 | 1-5 | 1-3 | 1-3 |
| $TiO_2$ | 2-6 | 2-6 | 3-5 | 3-5 |
| $B_2O_3$ | 13-21 | 11-21 | 15-20 | 13-20 |

Both the precursor melt glass composition and its subsequent dilution with a predetermined amount (0-15%) of alumina ($Al_2O_3$) powder are important aspects of the invention. The invented glass material composition is free of lead oxide and similar materials which undergo significant reduction when fired in reducing atmospheres. Several examples of the melt glass and its physical characteristics are shown in Table II.

TABLE II

| | Weight Percent Composition of the Melt Glass | | | | |
|---|---|---|---|---|---|
| Ingredients | Example A | Example B | Example C | Example D | Example E |
| $SiO_2$ | 46.0 | 43.5 | 43.5 | 43.5 | 44.5 |
| $Al_2O_3$ | 2.0 | 7.0 | 7.0 | 9.5 | 9.5 |
| $K_2O$ | 4.0 | 3.5 | 4.0 | 4.0 | 4.0 |
| $Na_2O$ | 8.0 | 7.0 | 7.5 | 7.0 | 6.5 |
| $Li_2O$ | 4.0 | 4.0 | 4.0 | 4.0 | 3.5 |
| CaO | 1.0 | 1.0 | 1.0 | 1.0 | 1.0 |
| ZnO | 9.0 | 9.0 | 9.0 | 9.0 | 9.0 |
| BaO | 2.0 | 2.0 | 2.0 | 2.0 | 2.0 |
| $TiO_2$ | 4.0 | 4.0 | 4.0 | 4.0 | 4.0 |
| $B_2O_3$ | 20.0 | 19.0 | 18.0 | 16.0 | 16.0 |
| | 100.0 | 100.0 | 100.0 | 100.0 | 100.0 |
| Expansion × $10^{-7}$/°C (ave. 25-300° C.) | 89 | 83 | 91 | 89 | 84 |
| Density (gms/CC) | 2.67 | 2.63 | 2.65 | 2.65 | 2.63 |
| Strain Point ($10^{14.5}$ poises) | 436° C. | | | | |
| Anneal Point ($10^{13.0}$ poises) | 462° C. | | | | |
| Softening Point ($10^{7.6}$ poises) | 574° C. | | | | |
| Working Point ($10^4$ poises) | 762° C. | | | | |
| Approximate Seal temperature when | 750° C. | 800° C. | 800° C. | 800° C. | 800° C. |

TABLE II-continued

| | Weight Percent Composition of the Melt Glass | | | | |
|---|---|---|---|---|---|
| Ingredients | Example A | Example B | Example C | Example D | Example E |
| mixed with 10 wt. % alumina. | | | | | |

The following is a description of the method of preparation of a glass material falling within the range of compositions shown in Table I and II. A typical melt was prepared by using the powdered materials shown in Table III. The gram weights of materials in Table III are those used to produce metal glass example D of Table II. Calculation of the starting material weights necessary to achieve other glass compositions within the ranges specified in Table I will be obvious to those of skill in the art.

TABLE III

Example of a Melt Glass Raw Materials Batch

| Raw Material | Weight in Grams |
|---|---|
| $SiO_2$ | 217.5 |
| $Al_2(OH)_3$ | 72.7 |
| $K_2CO_3$ | 29.3 |
| $Na_2CO_3$ | 34.2 |
| $NaNO_3$ | 41.1 |
| $Li_2CO_3$ | 49.4 |
| $CaCO_3$ | 8.9 |
| $ZnO$ | 45.0 |
| $BaCO_3$ | 12.8 |
| $TiO_2$ | 20.0 |
| $H_3BO_3$ | 142.1 |

The above batch of ingredients was melted within a platinum crucible having a diameter and height of 3 inches (7.6 cm). The crucible was filled approximately 80% full and lowered into an electrically heated laboratory furnace held at 1250° C. Following a 15-minute melt-down of the initial crucible charge, the crucible was removed and additional material was added and the crucible returned to the furnace. This procedure was repeated about four times until all of the batch of material had been placed in the crucible.

One half hour after the last additoon of material, a platinum stirrer having a 2 in. (5.4 cm) diameter propeller blade was immersed about 1 in. (2.5 cm) into the molten glass and the melt stirred at 90 rpm for one and one-half hours at 1250° C. followed by a temperature reduction to about 1100° C. with continued stirring for thirty minutes. The crucible was then removed from the furnace and a small amount of melt glass was poured into a steel mold to obtain a one inch (2.5 cm) diameter disc about one quarter inch (0.6 cm) thick. This disk was used to determine the physical properties of the melt glass. The hot disc of glass was annealed for 20 minutes at 500° C. in a laboratory furnace, after which the furnace was shut off and the disc and furnace allowed to cool together.

The balance of the melt glass was poured into water to produce glass in a "frit" form. The melt glass frit was dried, ground in a ball-mill and, in this example, mixed with 10% (by weight) alumina powder. (The alumina powder was RC-122BM type available from Reynolds Aluminum, Incorporated of Richmond, Virginia.) Larger or smaller amounts of alumina powder may be added. Both the sealing temperature and the final glass strength increase with increasing alumina content. The amount of alumina powder mixed with the ground melt glass can be in the range of 0–15% alumina, with 5–15% being convenient and 8–12% preferred. When the amount of added $Al_2O_3$ is small, i.e. 0–5% by weight, it is desirable to use a melt glass having at least 5% $Al_2O_3$ in the original mixture so as to have a total of about 5–7% $Al_2O_3$ in the sealing glass, otherwise, the glass strength is undesirably reduced.

The melt glass/alumina ceramic powder mixture which constitutes the sealing glass was made into preforms of dimensions suitable for sealing lead-in wires into TO-3 or other types of package bases. The preforms were prepared by molding the sealing glass powder into the appropriate shapes under pressure in a small press, and then sintering at, typically, 600° C. for 10 minutes in air. Techniques for preparing preforms for assembling electrical device enclosures are well known in the art.

The metal components of the device package, that is, the metal base and the lead-in wires or pins were nickel alloy plated prior to glass sealing by methods well known in the art. The compression seals were made by assembling the metal components and the glass preforms in a graphite fixture in order to properly position the parts. The sealing glass was sealed to the metal components by passing the assembled parts through a standard belt furnace having a peak temperature of approximately 800° C. and a forming gas atmosphere.

The melt glass contains 2–12% alumina and preferably 7–11% alumina, determined as a percentage of total weight after melting. Varying amounts of powdered alumina can be added after the melt is ground; 0–15% being useful, 5–15% being convenient, and 8–12% being preferred, these percentages being determined from the weight of added alumina divided by the total of the weight of the ground melt glass into which it is mixed plus the weight of the added alumina. Thus, the alumina concentration in the final sealing glass varies from a minimum of 2% for the lower melt glass limit (2%) with no $Al_2O_3$ powder added to a maximum of 25% for the upper melt glass limit (12%) with 15% $Al_2O_3$ powder added. A narrower and preferred range of alumina concentration in the final sealing glass is 7–22%, where the amount of added alumina powder making up this concentration varies from a low of zero to a high of 12% of the ground melt weight. This gives better control over the properties of the glass and generally better results than the wider range of compositions.

Where 5–15% alumina has been added to the useful range (see Table I) of melt glass compositions, this added alumina powder represents 30–90% of the alumina present in the final sealing glass. Where a narrow range of 8–12% alumina has been added, this added alumina represents 42–87% of the alumina present in the final sealing glass.

Several examples of the melt glass and its physical characteristics were shown in Table II. The weight percent compositions given in Table II are the composition of the melt glass, i.e., prior to addition of the powdered alumina. The melt glass raw materials composition given in Table III corresponds to Example D of Table II. Table II also includes the approximate sealing temperature of the different glass examples after being mixed with approximately 10% (by weight) of alumina powder. Table IV shows the composition in weight percent of the sealing glasses obtained by taking the melt glasses of Table II and adding 10% alumina.

TABLE IV

Weight Percent Composition of Sealing Glass Containing 10% Added Alumina Powder

| Ingredients | Example A | Example B | Example C | Example D | Example E |
|---|---|---|---|---|---|
| $SiO_2$ | 41.4 | 39.2 | 39.2 | 39.2 | 40.1 |
| $Al_2O_3$ | 11.8 | 16.3 | 16.3 | 18.6 | 18.6 |
| $K_2O$ | 3.6 | 3.2 | 3.6 | 3.6 | 3.6 |
| $Na_2O$ | 7.2 | 6.3 | 6.8 | 6.3 | 5.9 |
| $Li_2O$ | 3.6 | 3.6 | 3.6 | 3.6 | 3.2 |
| CaO | .9 | .9 | .9 | .9 | .9 |
| ZnO | 8.1 | 8.1 | 8.1 | 8.1 | 8.1 |
| BaO | 1.8 | 1.8 | 1.8 | 1.8 | 1.8 |
| $TiO_2$ | 3.6 | 3.6 | 3.6 | 3.6 | 3.6 |
| $B_2O_3$ | 18.0 | 17.1 | 16.2 | 14.4 | 14.4 |
| | 100.0 | 100.0 | 100.0 | 100.0 | 100.0 |

To manufacture a glass corresponding to the composition of Example D in Table II, the quantities of raw materials shown in Table III were used for a 500 gram total melt weight. Gaseous by-products (e.g. $CO_2$, $H_2O$, $O_2$, $N_2$, $N_2O$, NO, $N_2O_3$, etc.) evolved during melting account for the difference between the starting weight (673 grams) and the final weight (500 grams) of the melt. The glass compositions shown in Table II and the melt glass compositions of Table I were determined by taking the weights of materials placed into the melting crucible and subtracting the weight of these gaseous by-products. The glass compositions shown in Table IV were calculated from Table II by taking into account the additional alumina powder mixed into the ground melt glass. The sealing glass compositions Table I also include the added alumina.

The finished glass compression seals are expected to have a slightly different actual composition than the composition of the glass materials shown in Tables II and IV. This is due to the loss of volatile constituents, mainly alkalis and boron oxide, during heating. The volatile constituent loss occurs principally during initial melting where the highest temperatures are encountered and may be as much as 1% of total alkalis (i.e. $K_2O+Na_2O+Li_2O$) plus as much as another 1% of boron oxide. Thus, a compression glass seal made, for example, from glass D of Tables II and IV is expected to have a slightly lower alkali or boron oxide content than that listed for glass D in Tables II and IV. However, the total alkali and boron oxide loss decreases as the size of the melt increases. The ranges of compositions shown in Table I take into account the loss of as much as 1% of total alkalis and 1% of boron oxide and give the best available values for the composition ranges of the glass after melting.

The coefficients of expansion listed in Table II for exemplary glasses A-E are comparable to those reported by Simpson in U.S. Pat. No. 4,128,697, but the sealing temperatures even after dilution with 10% (weight percent) alumina are significantly lower. They are in the range 750°-800° C. as compared to the prior art values of approximately 1000° C. It has been determined that the invented sealing glass has the proper coefficient of expansion, has good strength and resistance to mechanical shock, has good resistance to corrosive and reducing atmospheres, withstands thermal cycling, resists devitrification, and has good electrical properties.

The ability of the semiconductor package to withstand temperature shock and thermal cycling, was tested by taking package bases in which compression sealed leads had previously been installed using the invented glass composition, and subjecting them to the following thermal cycle in a belt furnace.

1. Heat to 415° C. in seven minutes.
2. Cool 180° C. in the next 0.75 minutes.
3. Heat to 415° C. in the next three minutes.
4. Cool 250° C. in the next 4.5 minutes.
5. Remove from furnace at 200° C. into ambient air at 25° C.

Following completion of this temperature cycle, the package bases were leak tested and found to be hermetic.

It has been found that the melt glasses are, by themselves, also useful as sealing glasses. For example, glass samples of the type shown in Example E of Table II and corresponding generally to the preferred melt glass composition range of Table I were processed as previously described but without addition of powdered alumina after grinding. Hermetic seals were formed and tested. The strength was somewhat reduced as a consequence of the lower $Al_2O_3$ content, but the advantages of lower sealing temperature, good chemical resistance, good adhesion and other desirable properties were retained. While it is preferable for the best sealing glass performance that a portion of the alumina be added in powder form after melting and grinding the melt glass, useful though weaker glasses can be made without this two step procedure.

Thus it is apparent that there has been provided in accordance with this invention an improved glass composition for compression glass seals, a glass composition having reduced sealing temperature compatible with the use of metal parts which have been pre-plated with temperature sensitive coatings or are made from temperature sensitive materials, an improved method for making compression glass seals, and improved semiconductor device packages and semiconductor devices with glass compression seals able to withstand corrosive and reducing atmospheres and thermal cycling without loss of hermeticity. Further, the ability to plate the metal parts before sealing rather than after sealing provides a significant manufacturing convenience and cost saving.

Having thus described the invention, it will be obvious to those of skill in the art that various modifications can be made within the spirit and scope of the present invention. For example, other protective platings or enclosure material combinations may be used to advantage besides electroless nickel alloys and steel, so long as they have a melting point exceeding the 750°-800° C. sealing range of the present glass compositions, and appropriate expansion properties. Gold and silver are examples of other useful corrosion-resistant plating materials. It will be further apparent to those of skill in the art that the present invention applies to a wide variety of different package configurations besides the TO-3 example describeed. It is intended to encompass all such variations as fall within the spirit and scope of the invention.

We claim:
1. A lead-free glass plus alumina ceramic sealing material consisting essentially of a composition by weight percent in the range of:

| Ingredients | Composition Range |
|---|---|
| $SiO_2$ | 34–50 |
| $Al_2O_3$ | 2–25 |
| $K_2O$ | 2–6 |

-continued

| Ingredients | Composition Range |
|---|---|
| $Na_2O$ | 4-9 |
| $Li_2O$ | 2-6 |
| CaO | 0-4 |
| ZnO | 4-12 |
| BaO | 1-5 |
| $TiO_2$ | 2-6 |
| $B_2O_3$ | 11-21 |

2. The glass plus alumina ceramic sealing material of claim 1 wherein the composition consists essentially of ingredients by weight percent in the range of:

| Ingredients | Composition Range |
|---|---|
| $SiO_2$ | 38-47 |
| $Al_2O_3$ | 7-22 |
| $K_2O$ | 3-5 |
| $Na_2O$ | 5-8 |
| $Li_2O$ | 3-5 |
| CaO | 1-2 |
| ZnO | 6-10 |
| BaO | 1-3 |
| $TiO_2$ | 3-5 |

-continued

| Ingredients | Composition Range |
|---|---|
| $B_2O_3$ | 13-20 |

3. A lead-free sealing glass which is resistant to reduction when fired in reducing atmospheres, wherein said lead-free sealing glass has an average coefficient of thermal expansion between 25° C. and 300° C. in the range $83-91 \times 10^7$ per °C., consisting essentially of ingredients by weight percent in the range of:

| Ingredients | Composition Range |
|---|---|
| $SiO_2$ | 43-47 |
| $Al_2O_3$ | 7-11 |
| $K_2O$ | 3-5 |
| $Na_2O$ | 6-8 |
| $Li_2O$ | 3-5 |
| CaO | 1-2 |
| ZnO | 7-10 |
| BaO | 1-3 |
| $TiO_2$ | 3-5 |
| $B_2O_3$ | 5-20 |

4. The lead-free sealing glass of claim 3 plus 0-15% of powdered alumina added thereto.

* * * * *